(12) United States Patent
Sayegh

(10) Patent No.: US 11,953,556 B2
(45) Date of Patent: Apr. 9, 2024

(54) METHOD FOR DETERMINING THE OPERATING STATE OF A BATTERY AND BATTERY IMPLEMENTING SUCH A METHOD

(71) Applicant: SAFRAN ELECTRICAL & POWER, Blagnac (FR)

(72) Inventor: Marie Sayegh, Moissy-Cramayel (FR)

(73) Assignee: SAFRAN ELECTRICAL & POWER, Blagnac (FR)

( * ) Notice: Subject to any disclaimer, the term of this patent is extended or adjusted under 35 U.S.C. 154(b) by 3 days.

(21) Appl. No.: 17/260,872

(22) PCT Filed: Jul. 16, 2019

(86) PCT No.: PCT/FR2019/051783
§ 371 (c)(1),
(2) Date: Jan. 15, 2021

(87) PCT Pub. No.: WO2020/016521
PCT Pub. Date: Jan. 23, 2020

(65) Prior Publication Data
US 2021/0270903 A1 Sep. 2, 2021

(30) Foreign Application Priority Data
Jul. 17, 2018 (FR) ..................... 1856603

(51) Int. Cl.
*G01R 31/374* (2019.01)
*G01R 31/00* (2006.01)
(Continued)

(52) U.S. Cl.
CPC ......... *G01R 31/374* (2019.01); *G01R 31/008* (2013.01); *G01R 31/3647* (2019.01); *G01R 31/392* (2019.01)

(58) Field of Classification Search
CPC ............... G01R 31/374; G01R 31/392; G01R 31/3647; G01R 31/008; G01R 31/367; G06N 3/08; G06N 3/04; G06Q 10/04
(Continued)

(56) References Cited

U.S. PATENT DOCUMENTS 4,968,942 A * 11/1990 Palanisamy .......... G01R 31/379
324/427
9,157,968 B1 10/2015 Taylor et al.
(Continued)

FOREIGN PATENT DOCUMENTS

WO 2015101731 A1 7/2015

OTHER PUBLICATIONS

International Search Report and Written Opinion dated Oct. 28, 2019, in international application No. PCT/FR2019/051783, filed Jul. 16, 2019, 10 pages.

*Primary Examiner* — Christopher P Mcandrew
*Assistant Examiner* — Trung Q Nguyen
(74) *Attorney, Agent, or Firm* — CHRISTENSEN O'CONNOR JOHNSON KINDNESS PLLC

(57) ABSTRACT

Methods for determining an operating state of a battery with respect to one or more use profiles include: a step of prior learning during which operational limits of the battery are defined depending on parameters of the battery; the operational limits defining an operational zone in which the battery carries out the one or more use profiles, and a non-operational zone in which the battery does not carry out the one or more use profiles; a step of determining the operating state of the battery for a given use profile in the course of which the parameters of the battery in operation are determined; and a comparison step in which the opera-
(Continued)

tional limits and the parameters of the battery are compared and the battery is positioned in the operational or non-operational zone.

12 Claims, 3 Drawing Sheets

(51) Int. Cl.
  *G01R 31/36* (2020.01)
  *G01R 31/392* (2019.01)
(58) Field of Classification Search
  USPC .................................................. 324/400–431
  See application file for complete search history.

(56) References Cited

U.S. PATENT DOCUMENTS

| | | | | |
|---|---|---|---|---|
| 2007/0069734 | A1* | 3/2007 | Bertness | H02J 7/00036 |
| | | | | 324/411 |
| 2011/0035614 | A1* | 2/2011 | Hughes | H01M 10/48 |
| | | | | 713/340 |
| 2015/0292958 | A1 | 10/2015 | Schnetker | |
| 2017/0052229 | A1* | 2/2017 | Eckert | H01M 10/48 |

* cited by examiner

METHOD FOR DETERMINING THE OPERATING STATE OF A BATTERY AND BATTERY IMPLEMENTING SUCH A METHOD

CROSS REFERENCES TO RELATED APPLICATIONS

This application is a National Stage of International Application PCT/FR2019/051783 filed Jul. 16, 2019, which claims the priority to French Patent Application No. 1856603, filed Jul. 17, 2018, the entire disclosures of which are hereby incorporated by reference.

BACKGROUND

Traditionally, in the event failure of a battery, the control system thereof takes certain actions, often starting by disconnecting the battery from the electrical system to which it is connected.

The battery communicates with the electrical distribution system solely on its operating state.

A battery may be unavailable, with respect to a use profile that is demanded of it, because of a change to its parameters that have an influence on its performance.

The incapacity of the battery may result from an insufficient state of charge, or SOC, or from a drop in its performance because of an excessively low temperature.

When the temperature of the battery decreases, the available capacity, i.e. the capacity that it is capable of exchanging with a charge, decreases. Likewise, the internal resistance value of the battery increases when the temperature drops, causing a consequent drop in the voltage delivered. Thus, when the voltage that the battery is capable of supplying drops below a minimum threshold value, the battery becomes incapable of performing the task that is entrusted to it. Whereas the available capacity of the battery depends on the operational conditions, the stored capacity is that which is actually present in the battery. When the operating conditions are optimum, the available capacity returns to the stored capacity. Such is in particular the case at a low current state or at high temperature.

Apart from the aforementioned parameters of the battery, the incapacity of the battery to deliver a use profile may also result from the ageing thereof, which depends on the conditions of use and storage of the battery.

The ageing of the battery has an influence on the available capacity of the battery but also on its internal resistance, thus contributing to limiting the availability of the battery, depending on the ageing thereof.

Methods are known in the prior art for estimating the suitability of a battery for supplying a predetermined power profile. However, such methods are not satisfactory.

SUMMARY

The invention relates, in general terms, to batteries of electrical accumulator cells and relates more particularly to controlling the correct operation of such a battery in order to ensure that the battery is capable of meeting operating conditions, or use profiles, that are imposed thereon.

More particularly, the invention relates to a method for determining the operating state of a battery installed onboard an aircraft.

In the light of the above, an objective of the invention is to analyse the operating state of the battery with respect to a predetermined use profile.

Another aim of the invention is to provide a method for determining the operating state of a battery making it possible to provide the operating state of the battery with respect to a use profile in order in particular to implement actions for acting on the operating parameters of the battery so that it is in a position to satisfy the use profile that is demanded of it.

An object of the invention is therefore, according to a first aspect, a method for determining the operating state of the battery with respect to one or more use profiles, comprising:
  a step of prior learning during which, for one or more use profiles, operational limits of said battery are defined depending on parameters of the battery; said operational limits delimiting an operational zone in which the battery carries out the use profile or profiles and an non-operational zone in which the battery does not carry out the use profile or profiles;
  a step of determining the operating state of the battery for a given use profile during which the parameters of the battery in operation are determined, and
  a comparison step in which the operational limits resulting from the learning step and parameters of the battery in operation resulting from the determination step are compared and the battery is positioned in the operational or non-operational zone.

Thus the prior learning phase makes it possible to know, for each use profile, the operational limits between an available state and an unavailable state, depending on the parameters of the battery.

It is thus possible to know the future availability of the battery for a use profile to be tested by comparing with the predetermined operational limits.

In one embodiment, the parameters of the battery comprise the temperature, the level of charge of the battery and one or more ageing parameters of the battery.

For example, the parameters of the battery are the internal resistance and the available capacity of the battery.

According to another characteristic, the method further comprises an analysis step in which the parameter or parameters to be adjusted for the battery to return to the operational zone are analysed.

For example, the parameter or parameters to be adjusted are chosen from the temperature and the level of charge.

Another object of the invention, according to another aspect, is a battery comprising a system for managing the operating state of the battery, which includes memory means having operational limits of the battery stored therein depending on parameters of the battery, said operational limits delimiting an operational zone in which the battery carries out the use profile or profiles and a non-operational zone in which the battery does not carry out the use profile or profiles, means for determining parameters of the battery in operation for a given use profile and comparison means for comparing the operational limits stored in the memory means and said parameters in the battery and for positioning the battery in the operational or non-operational zone.

DESCRIPTION OF THE DRAWINGS

Other aims, features and advantages of the invention will emerge from reading the following description given solely by way of non-limitative example and made with reference to the accompanying figures, in which.

DETAILED DESCRIPTION

The main steps of a method for determining the operating state of a battery according to one embodiment of the invention will now be described with reference to FIGS. 1 to 3. This method is for example implemented to control the operation of a battery in an installed system, in particular installed onboard an aircraft.

This method is advantageously implemented by a management system that is for example integrated in the battery and which is duly programmed to implement such a method.

The method according to the invention includes essentially two phases, one being a learning phase and the other being a test phase proper.

During the learning phase, the operational limits of the battery are determined for a set of use profiles, depending on the parameters of the battery that will have an influence on its performance.

These operating parameters are in particular the temperature of the battery and the state of charge (SOC) of the battery.

This prior learning phase consists in implementing tests, for each use profile of a set of predetermined use profiles. These tests are performed, for each use profile, at several temperatures and states of charge, in order to determine the operational limits of the battery for the use profile in question.

Figure 1:
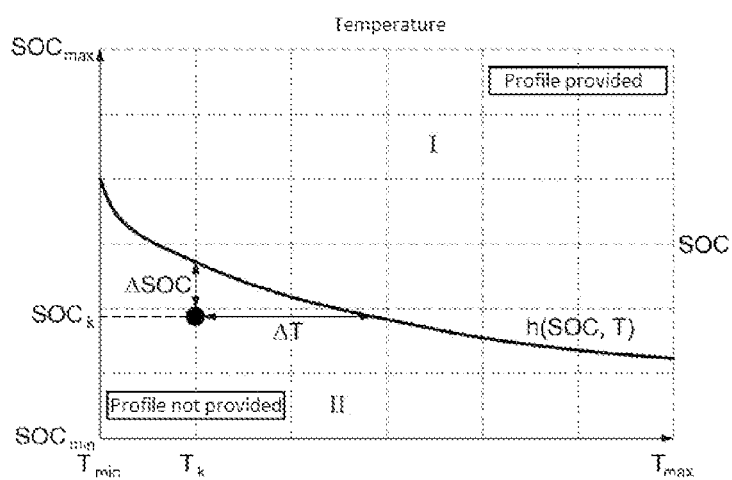
FIG. 1 shows the operational limit of a battery, depending on the change in the temperature and the state of charge, which is obtained at the end of the first learning phase.

As illustrated in FIG. 1, these test phases are for example performed from a minimum temperature Tmin to a maximum temperature Tmax and for states of charge between a minimum value SOCmin and a maximum value SOCmax. Each test phase consists in checking whether the battery, for a given temperature T and a given state of charge SOC, is capable of providing the use profile that is demanded of it, in terms of voltage level, current level, power or electrical energy, for a predefined period or predefined ranges of periods.

The operational limit is here a function h(SOC,T) that makes it possible to distinguish between a "profile provided" operational state of the battery (zone I) with respect to a given operational profile and a "profile not provided" non-operational state (zone II) with respect to the use profile considered.

Figure 2:
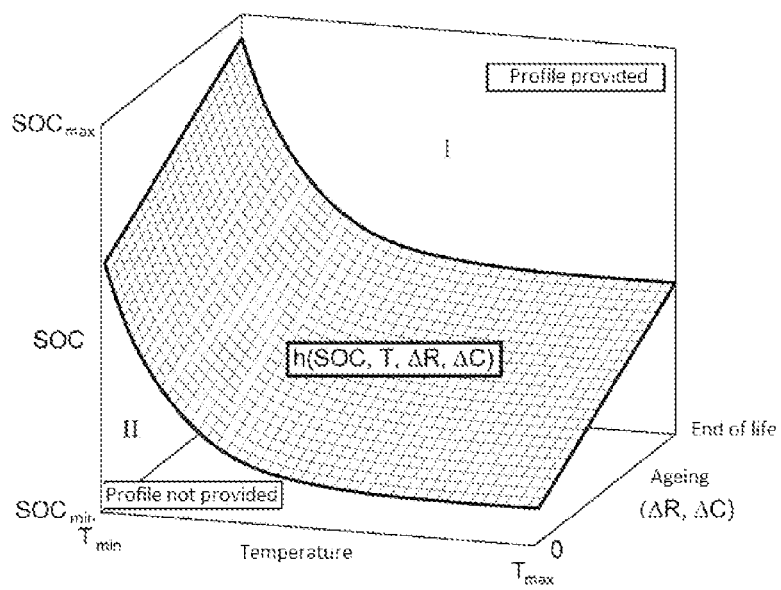
FIG. 2 shows the change in the operational limit of a battery depending on the variation in the stage of charge, the temperature of the battery and its ageing state, which is obtained at the end of the first learning phase.
Figure 3:
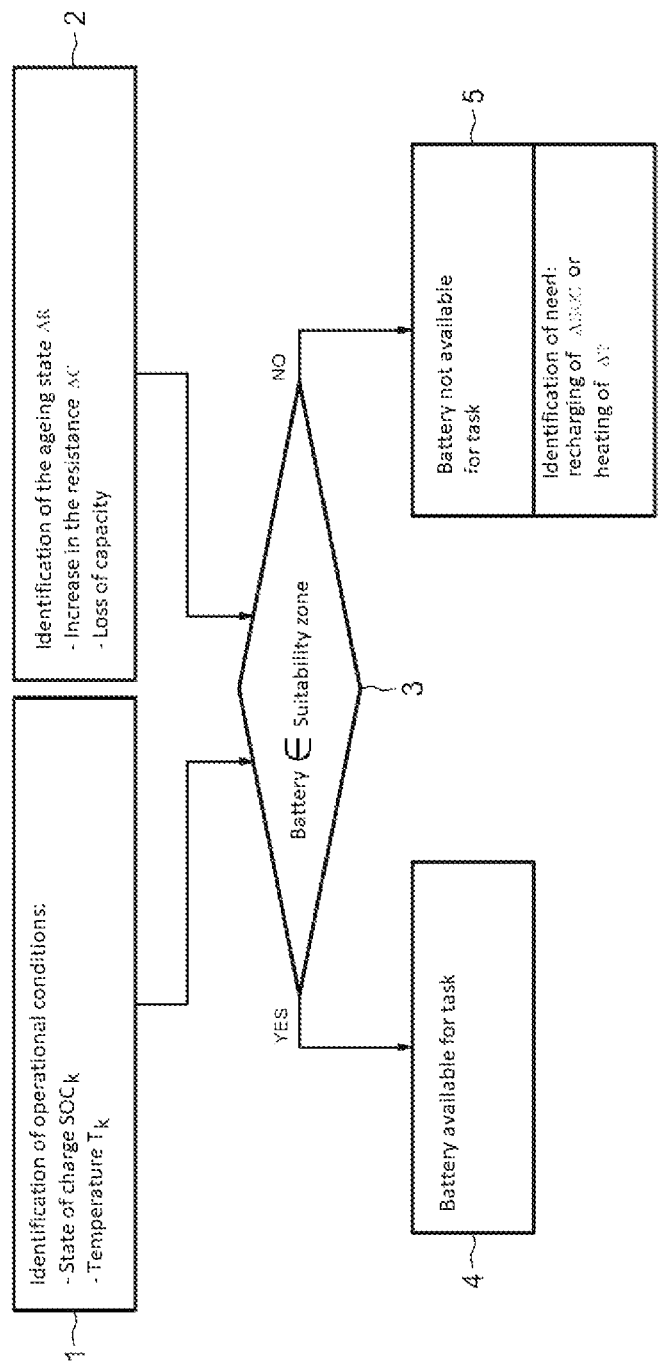
FIG. 3 shows the main steps of the test phase of the method according to the invention.

As shown by FIG. 2, these tests are furthermore performed for various ageing states, i.e. for various values of variation in internal resistance and available capacity of the battery ΔR and ΔC varying between 0, for a new battery, and ΔRmax and ΔCmax.

Thus the operational limit between an operational state and a non-operational state with respect to a given use profile is delimited by a surface h(SOC,T,ΔR,ΔC) varying depending on the state of charge between a minimum value SOCmin and a maximum value SOCmax and temperature values varying between a minimum value Tmin and a maximum value Tmax and varying depending on the ageing of the battery, between a new state (ΔR=0 and ΔC=0) and a state of maximum ageing (ΔR=ΔRmax and ΔC=ΔCmax).

During a test phase proper of the battery, to check whether the battery is capable of providing a use profile to be tested, during a first step 1, an identification of the current parameters of the battery is carried out. These parameters here consist of the operational conditions comprising the state of charge SOCk and the temperature Tk.

The ageing state of the battery is also identified by determining the increase in the internal resistance ΔR and the loss of capacity ΔC (step 2).

This ageing state, and in particular the values of increase in the internal resistance and in capacity, can be obtained by means of conventional techniques, for example using a test algorithm.

Referring for example to FIG. 1, the operating point thus determined (SOCk,Tk) is determined with respect to the operational limit.

Thus, in the following step 3, the operating point thus determined and the operational limit are compared.

If the battery is in the suitability zone, it is then considered that the battery is available for the task that is entrusted to it (step 4).

If such is not the case, it is considered that the battery is unavailable (step 5).

However, during this step, the variations ΔSOC and ΔT to be made to the state of charge on the one hand and to the temperature on the other hand to enable it to reach the operational zone are determined.

The heating value ΔT is in particular an indicator internal to the battery since the heater, when it is present, is generally integrated in the battery and is regulated by the control system.

The recharging demand is on the other hand an external indicator that is delivered outside the battery in order to cause recharging thereof.

In the embodiment that has just been described, the operational limits are fixed for each use profile.

Figure 4:
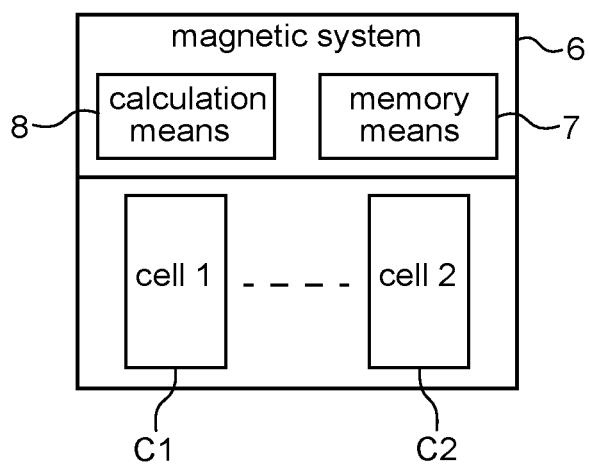
FIG. 4 is a schematic view of a battery implementing a method according to the invention.

With reference to FIG. 4, the method that has just been described can advantageously be implemented in a battery comprising a set of cells Cl, Cn and a management system 6 including memory means 7 having operational limits of the battery stored therein depending on parameters of the battery that have an influence on the performance of the battery, for a set of use profiles, and calculation means 8 including means for determining current parameters of the battery and means for comparing a use profile to be tested with operational limits extracted from the memory means and corresponding to said current parameters, for said use profile to be tested.

In the text, it is mentioned that the availability of the battery is dependent on the ageing state (ΔR and ΔC) but it has not been specified how to identify this state. This state can be obtained by usual means of the algorithm type and/or tests.

The invention claimed is:

1. A method for determining an operating state of a battery with respect to one or more use profiles, comprising:
defining, for the one or more use profiles, operational limits inside of a memory of said battery depending on parameters of the battery comprising a temperature, a level of charge of the battery, and one or more ageing parameters of the battery, wherein said operational limits delimit an operational zone in which the battery carries out the one or more use profiles and a non-operational zone in which the battery does not carry out the one or more use profiles, wherein the operational limits are defined by implementing tests for each of the one or more use profiles by checking whether the battery is capable of providing the use profile in a temperature range, in a level of charge range, and in an ageing parameter range;

determining the operating state of the battery for a given one of the one or more use profiles based upon determining the parameters with a calculator integrated into the battery;

comparing the operational limits and the parameters of the battery with the calculator;

analyzing one or more of the parameters; and adjusting the temperature or a level of charge of the battery to return the battery to the operational zone.

2. The method according to claim 1, wherein defining the operational limits comprises defining a surface as a function of the temperature, the level of charge of the battery, and the one or more ageing parameters of the battery.

3. The method according to claim 1, wherein the one or more ageing parameters of the battery comprise an internal resistance and an available capacity of the battery.

4. The method according to claim 1, wherein the one or more analyzed parameters are selected from the group consisting of the temperature and the level of charge.

5. The method according to claim 1, wherein defining operational limits comprises implementing one or more tests, wherein a test of the one or more tests is performed for each use profile of the one or more use profiles at several parameter levels of a single parameter of the parameters of the battery.

6. A battery comprising:

a system for managing an operating state of the battery, the system comprising:

a memory storing therein operational limits of the battery, the operational limits depending on parameters of the battery comprising a temperature, a level of charge of the battery, and one or more ageing parameters of the battery, said operational limits delimiting an operational zone in which the battery carries out one or more use profiles and a non-operational zone in which the battery does not carry out the one or more use profiles, wherein the operational limits are defined by implementing tests for each of the one or more use profiles by checking whether the battery is capable of providing the use profile in a temperature range, in a level of charge range, and in an ageing parameter range; and a calculator configured to: determine the parameters of the battery in operation for a given one of the one or more use profiles; compare the operational limits stored in the memory and said parameters in the battery; wherein the calculator is configured to analyze the temperature or a level of charge of the battery, wherein the temperature or a level of charge of the battery are adjusted to return the battery to the operational zone.

7. The battery of claim 6, wherein the calculator is configured determine the parameters of the battery in operation by implementing one or more tests, wherein a test of the one or more tests is performed for each use profile of the one or more use profiles at several parameter levels of a single parameter of the parameters of the battery.

8. The battery of claim 6, wherein the operational limits are defined by defining a surface as a function of the temperature, the level of charge of the battery, and the one or more ageing parameters of the battery.

9. The battery of claim 6, wherein the one or more ageing parameters of the battery comprise an internal resistance and an available capacity of the battery.

10. The battery according to claim 6, wherein the one or more analyzed parameters are selected from the group consisting of the temperature and the level of charge.

11. A system comprising the battery according to claim 6.

12. An aircraft comprising the system according to claim 11.

\* \* \* \* \*